US010361081B2

(12) United States Patent
Colvin et al.

(10) Patent No.: US 10,361,081 B2
(45) Date of Patent: Jul. 23, 2019

(54) PHOSPHINE CO-GAS FOR CARBON IMPLANTS (71) Applicant: Axcelis Technologies, Inc., Beverly, MA (US)

(72) Inventors: Neil Colvin, Merrimack, NH (US); Tseh-Jen Hsieh, Rowley, MA (US)

(73) Assignee: AXCELIS TECHNOLOGIES, INC., Beverly, MA (US)

( * ) Notice: Subject to any disclaimer, the term of this patent is extended or adjusted under 35 U.S.C. 154(b) by 2 days.

(21) Appl. No.: 15/807,652

(22) Filed: Nov. 9, 2017

(65) Prior Publication Data

US 2018/0144940 A1 May 24, 2018

Related U.S. Application Data (60) Provisional application No. 62/426,251, filed on Nov. 24, 2016.

(51) Int. Cl.
*H01L 21/265* (2006.01)
*H01J 37/317* (2006.01)

(52) U.S. Cl.
CPC .......... *H01L 21/265* (2013.01); *H01J 37/317* (2013.01); *H01J 37/3171* (2013.01); *H01J 2237/31701* (2013.01)

(58) Field of Classification Search
CPC combination set(s) only.
See application file for complete search history.

(56) References Cited

U.S. PATENT DOCUMENTS

| 5,497,006 A | 3/1996 | Sferlazzo et al. |
| 2014/0151572 A1 | 6/2014 | Lin et al. |
| 2016/0020102 A1* | 1/2016 | Byl .................. H01J 37/08 438/22 |
| 2016/0211137 A1* | 7/2016 | Tang ................. H01J 37/3171 |

OTHER PUBLICATIONS

Haublein V. et al: "Investigation of lanthanum contamination from a lanthanated tungsten ion source", Sep. 22, 2003 (2003-G9-22), ION Implantation Technology. 2002. Proceedings of the 14th International Conference on, IEEE, pp. 346-349, XP010676904, ISBN: 978-0-7803-7155-2 abstract III. Experiments p. 347.
Notification of Transmittal of the International Search Report and The Written Opinion of the International Searching Authority, or the Declaration, issued in International Application No. PCT/US2017/061920, dated Feb. 21, 2018; 15 pages.

* cited by examiner

*Primary Examiner* — Ratisha Mehta
(74) *Attorney, Agent, or Firm* — Cantor Colburn LLP (57) ABSTRACT

Processes and systems for carbon ion implantation include utilizing phosphine as a co-gas with a carbon oxide gas in an ion source chamber. In one or more embodiments, carbon implantation with the phosphine co-gas is in combination with the lanthanated tungsten alloy ion source components, which advantageously results in minimal oxidation of the cathode and cathode shield, among other components within the ion source chamber.

13 Claims, 7 Drawing Sheets

| Compound | Melting point: | Boiling point: | Appearance |
|---|---|---|---|
| $LaF_3$ | 1493°C | 2327°C | crystalline solid |
| $La_2O_3$ | 2305°C | 4200°C | solid |
| $WF_6$ | 2°C | 17°C | gas |
| $WF_4$ | 800°C | n/a | solid |
| $WO_2$ | 1500°C | 1730°C | crystalline solid |
| $WO_3$ | 1473°C; 1470°C | 1837°C | solid |

Fig. 9

PHOSPHINE CO-GAS FOR CARBON IMPLANTS

CROSS-REFERENCE TO RELATED APPLICATIONS

This application is a NON-PROVISIONAL of U.S. Application Ser. No. 62/426,251, filed Nov. 24, 2016, the contents of which are incorporated by reference herein in its entirety.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources (commonly referred to as arc ion sources) generate ion beams used in implanters and can include heated filament cathodes for creating ions that are shaped into an appropriate ion beam for wafer treatment. U.S. Pat. No. 5,497,006 to Sferlazzo et al., for example, discloses an ion source having a cathode supported by a base and positioned with respect to a gas confinement chamber for ejecting ionizing electrons into the gas confinement chamber. The cathode of the Sferlazzo et al. is a tubular conductive body having an endcap that partially extends into the gas confinement chamber. A filament is supported within the tubular body and emits electrons that heat the endcap through electron bombardment, thereby thermionically emitting ionizing electrons into the gas confinement chamber.

Carbon has emerged as a widely used dopant in the semiconductor industry for a wide variety of material modification applications. For example, carbon implantation is often used to inhibit diffusion of co-dopants or for enhancing stability of the doped region. In this regard, carbon dioxide and/or carbon monoxide are two commonly used dopant gas sources for carbon implantation. The residual oxygen from the disassociation of the carbon molecule can oxidize the chamber liners as well as damage the cathode shield causing a premature failure of the ion source. Moreover, residual carbon deposits and flaking due to the cracking of carbon dioxide and/or carbon monoxide are also known to shorten ion source lifetimes.

BRIEF SUMMARY

Disclosed herein are processes and systems for implanting carbon into a substrate. In one or more embodiments, the process for implanting carbon into a substrate includes ionizing a carbon oxide gas source and a co-gas comprising phosphine in an ion source chamber to produce carbon ions and phosphorous oxide; and implanting the carbon ions into the substrate.

In one or more embodiments, a process for implanting carbon ions into a workpiece includes supplying a mixture of a carbon oxide gas and a phosphine gas to an ion source; ionizing the carbon oxide gas and the phosphine gas with the ion source at a stoichiometry effective to create a feedstream of ionized carbon and a byproduct comprising phosphorous oxides; extracting the ionized carbon within the plasma to form an ion beam; and exposing the workpiece to the ion beam to implant the ionized carbon into the workpiece.

The disclosure may be understood more readily by reference to the following detailed description of the various features of the disclosure and the examples included therein.

BRIEF DESCRIPTION OF THE DRAWINGS

Referring now to the figures wherein the like elements are numbered alike.

DETAILED DESCRIPTION

The present disclosure is directed generally toward carbon implantation utilizing phosphine ($PH_3$) gas as a co-gas with carbon gas sources such as carbon monoxide and/or carbon dioxide. In one or more embodiments, carbon implantation with phosphine as the co-gas is in combination with an ion implantation system including at least one conductive component therein formed of lanthanated tungsten. Advantageously, minimal oxidation is observed with the use of phosphine as a co-gas of ion implantation conductive components such as the cathode and cathode shield, for example.

Moreover, acceptable levels of carbon deposits on the arc chamber internal components including, among others the arc slit have been observed as well as marked reductions in tungsten oxide formation (i.e., $WO_x$, wherein x is from 1 to 6). As for the carbon ions that are generated, these ions can be selectively extracted and accelerated at high velocities suitable for ion implantation into a workpiece of interest. Carbon implants are generally in the 1-30 keV energy range and the doses vary from low to mid E13s to mid E15s depending on the application.

Accordingly, the present disclosure will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present disclosure may be practiced without these specific details. Further, the scope of the disclosure is not intended to be limited by the embodiments or examples described hereinafter with reference to the accompanying drawings, but are intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the disclosure. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Figure 1:
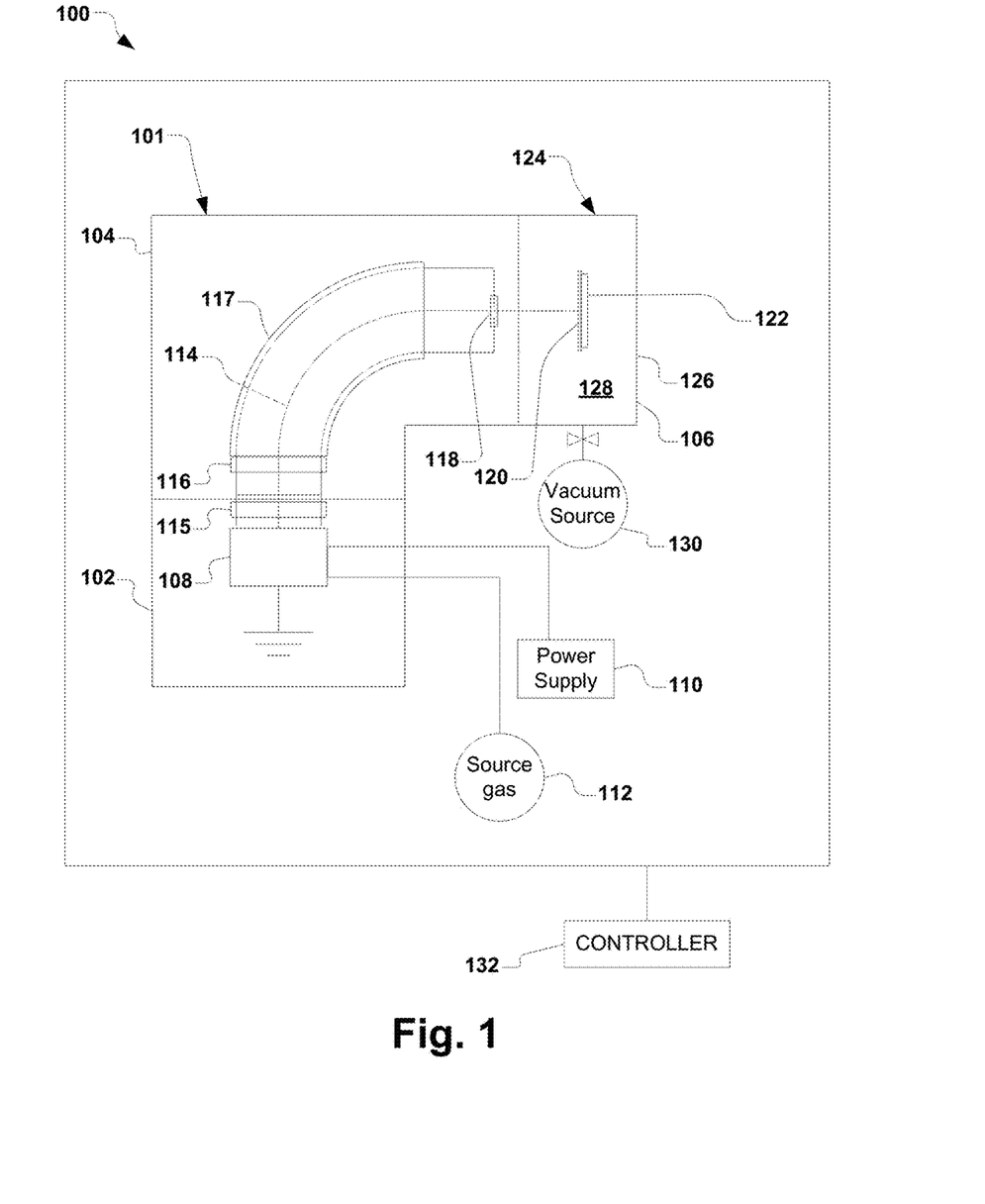
FIG. 1 is a block diagram of an exemplary ion implantation system in accordance with several aspects of the present disclosure.

In accordance with one aspect of the present disclosure, FIG. 1 illustrates an exemplary ion implantation system 100. The ion implantation system 100 in the present example generally includes a terminal 102, a beamline assembly 104, and an end station 106.

Generally speaking, an ion source 108 in the terminal 102 is coupled to a power supply 110 to ionize a dopant gas 112 (i.e., source gas) into a plurality of ions from the ion source to form an ion beam 114. The ion beam 114 is directed through an entrance 116 of a mass analyzer 117 and out an aperture 118 towards the end station 106. In the end station 106, the ion beam 114 bombards a workpiece 120, which is selectively clamped or mounted to a chuck 122, e.g., an electrostatic chuck. Once embedded into the lattice of the workpiece 120, the implanted ions change the physical and chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 includes a process chamber 124, such as a vacuum chamber 126, wherein a process environment 128 is associated with the process chamber. The process environment 128 generally exists within the process chamber 124, and in one example, includes a vacuum produced by a vacuum source 130 (e.g., a vacuum pump) coupled to the process chamber 124 and configured to substantially evacuate the process chamber 126. Further, a controller 132 is provided for overall control of the ion implantation system 100.

The ion source 108 (also called an ion source chamber), for example, can be constructed using refractory metals (W, Mo, Ta, etc.) and graphite in order to provide suitable high temperature performance, whereby such materials are generally accepted by semiconductor chip manufacturers. The source gas 112 is used within the ion source 108, wherein source gas may or may not be conductive in nature. However once the source gas 112 is cracked or fragmented, the ionized gas byproduct can be very corrosive. In the present disclosure, the source gas is a mixture including carbon oxide and at least phosphine as a co-gas.

The demand from device manufacturers for longer source life, increased ion beam currents, ion beam stability and non-dedicated species operation has pushed conventional ion source designs to their limits. Each of these demands are not mutually exclusive, however, whereby one or more performance characteristics are typically sacrificed to provide an ion source that does not fail prematurely.

The highly corrosive nature of oxides generated from cracking carbon oxides such as carbon monoxide (CO) and/or carbon dioxide ($CO_2$) and/or carbon suboxides ($C_3O_2$) challenges the conventional refractory metals used to construct the ion source 108 and components associated therewith. The formation of $WO_2$ and $WO_3$, for example, on the internal source components can negatively impact ion implantation transitions to other species, such as $^{11}B$ and $^{49}BF_2$, until the residual oxygen released from the tungsten oxides is below some threshold level.

In one or more embodiments, the present disclosure utilizes lanthanated tungsten alloys or lanthanated tungsten alloys with other refractory metals alloyed with a predetermined percentage of a rare earth metal for components (e.g., internal arc chamber components) associated with the ion source 108. In many cases, providing such lanthanated tungsten components can prevent damage from residual oxygen. The reaction of $O^-$ with lanthanum, for example, results in a protective surface layer which is very stable at temperatures greater than 2000° C., whereas tungsten oxides are very volatile (e.g., halogen cycle) and lead to shorter lifetimes of the ion source, as well as increased ion beam instabilities. Further, the ion source of the present disclosure provides improved cathode electron emission due to its lower work function and decreased formation of tungsten carbide or oxides on the cathode tip, thus reducing cathode electron emission for carbon implants.

In addition to using lanthanated tungsten alloys or lanthanated tungsten alloys with other refractory metals alloyed with a predetermined percentage of a rare earth metal to construct the arc internal components, the arc chamber body and other components of the ion implantation system that are downstream of the arc chamber can also be constructed utilizing such a material. For example, extraction electrode optics (e.g., suppression and ground apertures) and any other downstream ion beam defining apertures, liners, and ion beam strike plates can be formed of such a lanthanated tungsten material. Any components that are susceptible to etching or sputtering by extracted oxygen ions are considered as being candidates for being formed of such a material, where volatile corrosive conductive gases formed in conventional systems would typically coat critical insulators.

Figure 2:
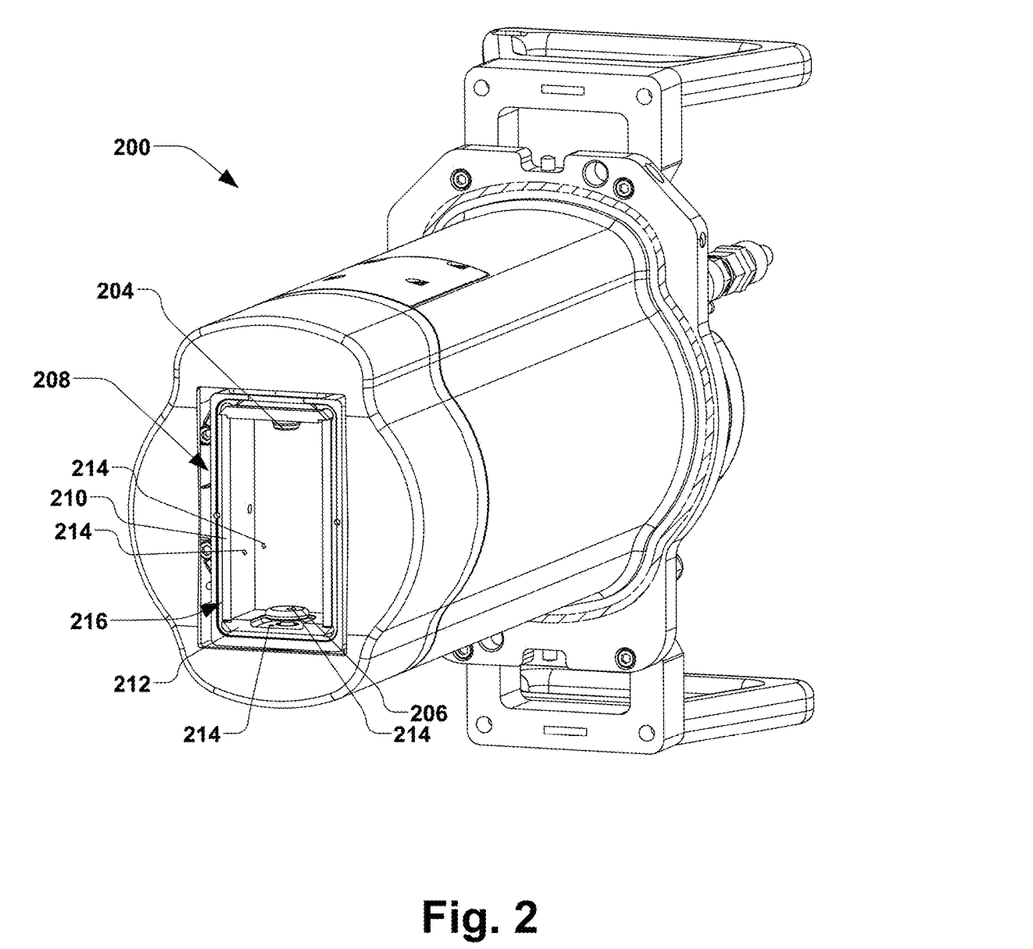
FIG. 2 illustrates a perspective view of an exemplary ion source for use in the present disclosure.

For example, in an ion source 200 illustrated in FIG. 2, the tungsten hexafluoride or other resultant material may decompose on surfaces 202 of various internal components 203 of the ion source, such as on surfaces of a cathode 204, a repeller 206 and arc slit optics (not shown) associated an arc chamber 208 of the ion source. This is called a halogen cycle as shown in equation, but the resultant material can also precipitate and/or condense back onto walls 210 or liners 212 or other components of the arc chamber 208, as well as the arc slit in the form of a contaminant material 214 (e.g., solid-state particulate contaminants). The liners 212, for example, comprise replaceable members 215 operably coupled to a body 216 of the arc chamber 208, wherein the liners are comprised of graphite or various other materials. The replaceable members 215, for example, provide wear surfaces that can be easily replaced after a period of operation of the arc chamber 208.

Another source of contaminant material 214 deposited onto the internal components 203 arises from the cathode 204 when the cathode is indirectly heated (e.g., a cathode composed of tungsten or tantalum), whereby the indirectly heated cathode is used to start and sustain the ion source plasma (e.g., a thermionic electron emission). The indirectly heated cathode 204 and the repeller 206 (e.g., an anticathode), for example, are at a negative potential in relation to the body 216 of the arc chamber 208, and both the cathode and repeller can be sputtered by the ionized gases. The repeller 206, for example, can be constructed from tungsten, molybdenum, or graphite. Yet another source of contaminant material 214 deposited on the internal components 203 of the arc chamber 208 is the dopant material (not shown), itself. Over time, these deposited films of contaminant material 214 can become stressed and subsequently delaminate, thereby shortening the life of the ion source 200.

The present disclosure advantageously can include the use of lanthanated tungsten alloy in ion implant systems to mitigate etching and contamination issues during carbon implantation. In one or more embodiments, the phosphine is utilized as a co-gas with carbon oxide sources such as carbon monoxide and/or carbon dioxide, and in some embodiments, in combination with the lanthanum tungsten alloy ion source components as described herein. In one or more other embodiments, the conductive components of the ion implantation system are formed of tungsten, or the like. The use of phosphine as the co-gas for carbon implants and the components formed or coated with lanthanated tungsten alloy provides numerous advantages.

For example, the main failure mode when using carbon monoxide and/or carbon dioxide as a dopant gas for carbon implantation is the oxidation and subsequent reduction in mass of the cathode and cathode shield. When running for extended times it is not uncommon for the cathode shield to oxidize at a very high rate leading to premature source failure. The introduction of phosphine as a co-gas with the carbon oxide gas source increases the formation of hydrocarbons by cracking of the phosphine molecule, which can be readily pumped from the source chamber rather than being deposited onto the interior surfaces. While not wanting to be bound by theory, it is believed that the presence of phosphorous results in the formation of phosphorous oxides such as $P_4O_6$ and $P_4O_{10}$, which have relatively low melting points of 23.8° C. and 422° C., respectively. These compounds can be pumped from the chamber while in vapor form, thereby significantly minimizing oxidation of the cathode and cathode shield. This can be especially advantageous for the cathode shield, which is typically the hottest component other than the cathode. Consequently, a balance can be achieved between cathode shield oxidation rate and carbon deposits based on the amount of available oxygen. Moreover, the optional use of lanthanated tungsten components will further reduce the cathode shield oxidation rate due to formation of a stable lanthanum oxide compound, e.g., $La_2O_3$.

The ratio of the carbon oxide to the phosphine co-gas can be readily optimized by detecting the formation of the phosphorous oxides based on analysis of the atomic mass unit (amu) spectra. The ratio is optimized once the phosphorous oxides are no longer detectable and the relative beam current is maintained at a desirable amount. The phosphine co-gas can be inserted as a separate gas from a different string or can be premixed in the same bottle beforehand, once a desired ratio has been determined. The operating pressures in the ion source are in the low to mid $E^{-5}$ Torr range. High current ion source life varies with species usage but can be several hundred hours.

Additionally, the use of lanthanum tungsten alloy to construct one or more of the internal arc chamber components as described herein minimizes and controls the halogen cycle. A protective film of $La_2O_3$ is produced from the carbon oxide gas as generally shown in reaction scheme I for carbon dioxide, which is thermally stable up to 2300° C.

$$24CO_2 + 8PH_3 + 4LaW \rightarrow 22C^+ + 24OH + 2CO + 2La_2O_3 + 4W + P_4O_6 + P_4O_{10} \qquad \text{I.}$$

As the $WLaO_3$ resides in the tungsten grain boundary, it will continually diffuse to the surface and replenish the protective coating. This in turn reduces the formation of volatile refractory gases. When lanthanum is sputtered, etched or evaporated into the arc chamber that contains tungsten, oxygen, or fluorine, the lanthanum does not form highly reactive and unstable components such as $MoF_x$, $WF_x$, and $TaF_x$. Instead, the presence of the lanthanum results in the formation of stable oxides or fluoride compounds that are also deposited onto the interior arc chamber surfaces, which further protects the interior surfaces.

Figure 3:
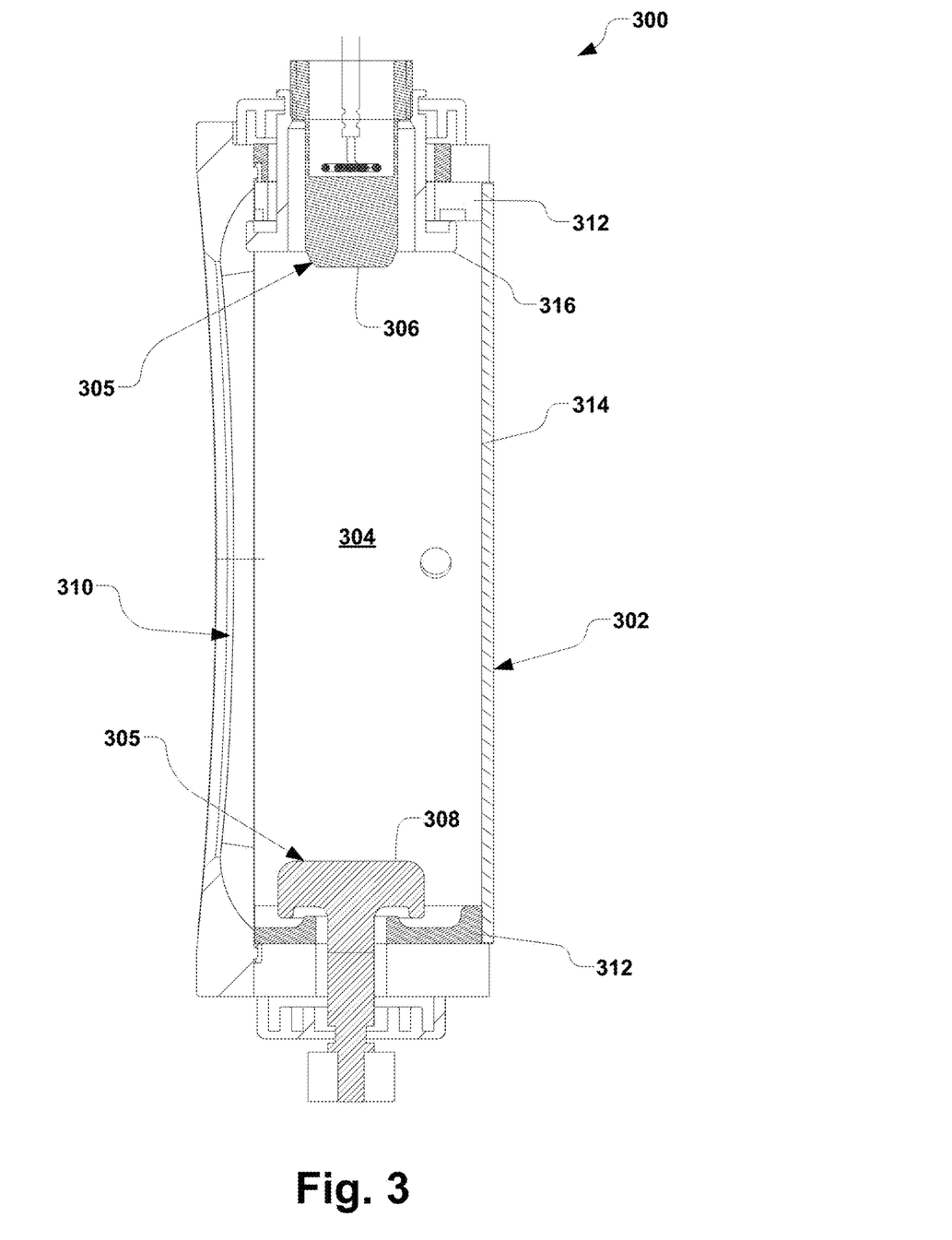
FIG. 3 illustrates a perspective view of an exemplary arc chamber for use in the present disclosure.

FIG. 3 illustrates an exemplary ion source 300 (also called an arc chamber or ion source chamber) in which the present disclosure may be utilized. The arc chamber 300 of FIG. 3 is similar in many ways to the arc chamber 208 of FIG. 2. As illustrated in FIG. 3, the arc chamber 300 has a body 302 defining and interior region 304 of the arc chamber. The arc chamber 300, for example, comprises one or more electrodes 304. The one or more electrodes 305, for example, comprise a cathode 306, and a repeller 308. The arc chamber 300, for example, further comprises an arc slit 310 for extraction of ions from the arc chamber. One or more liners 312 are operably coupled to the body 302 of the arc chamber 300. The body 302, for example, may further comprise one or more walls 314 operably coupled to, or integrated with, the body. In one example, a cathode shield 316 generally surrounds a periphery of the cathode 306.

In accordance with the present disclosure, one or more of the electrodes 305 (e.g., one or more of the cathode 306 and repeller 308), the cathode shield 316 comprise or are comprised of lanthanated tungsten. Further, one or more of the liners 312, walls 314, and/or extraction aperture 310 of the arc chamber 300 can comprise or are comprised of lanthanated tungsten. The present disclosure presently appreciates that lanthanated tungsten is more resistant to chemical attack as compared to pure tungsten used in convention ion sources. The presently considered theory is that lanthanated tungsten forms a lanthanum oxide layer on the exposed surface during the ionization process taking place in the arc chamber 300. Since this lanthanum oxide layer is chemically more stable than conventional chemistries, it generally inhibits further corrosion. It can be expected that utilizing phosphine as a co-gas will minimize oxidation and prolong operating lifetime.

Figure 4:
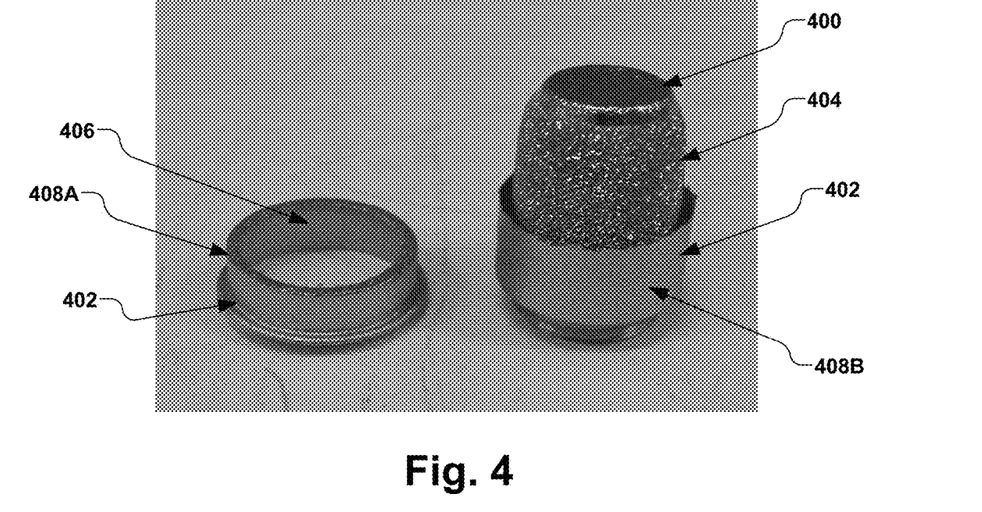
FIG. 4 illustrates a conventional tungsten cathode and shield after 20 hours of operation.

FIG. 4 illustrates a conventional cathode 400 and its corresponding cathode shield 402 (e.g., a tubular member that covers the cathode) after running $CO_2$ for 20 hours, wherein the cathode and cathode shield are formed of tungsten. As illustrated in FIG. 4, severe oxidation 404 of the cathode shield 402 and its subsequent deposition through thermal decomposition onto the cathode sidewall 406 are present. As shown in FIG. 4, the shield 402 has been oxidized such that the shield has been deleteriously separated into two pieces 408A and 408B.

Figure 5:
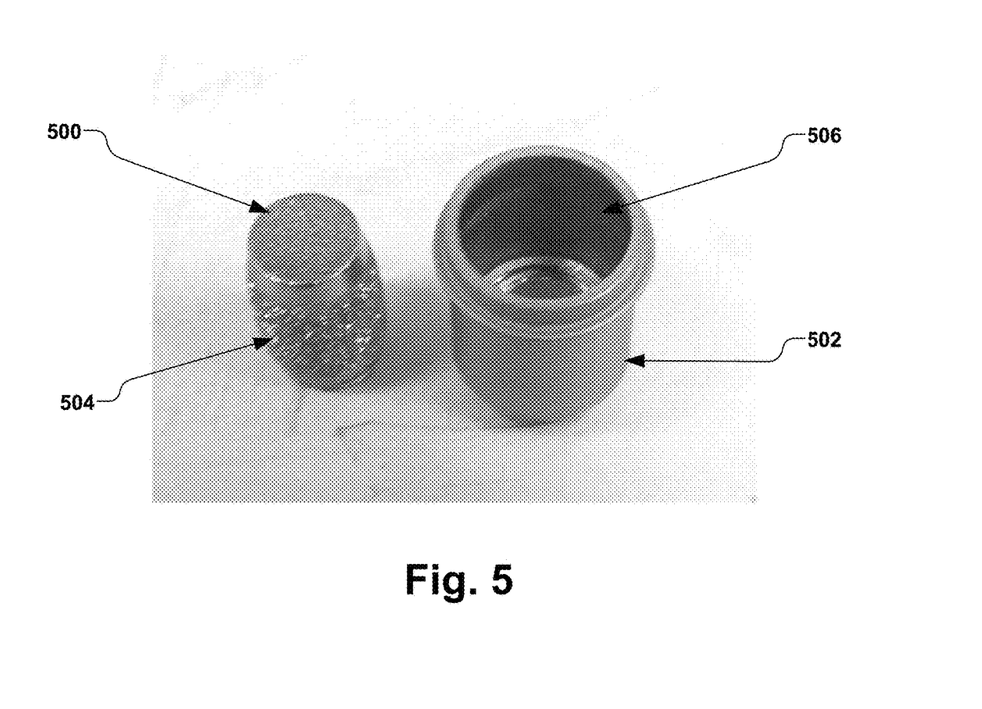
FIG. 5 illustrates a lanthanated tungsten cathode and shield after 20 hours of operation.

FIG. 5 illustrates cathode 500 and corresponding cathode shield 502 after running $CO_2$ for 20 hours, wherein the cathode and cathode shield are comprised of lanthanum tungsten. As illustrated in FIG. 5, the reduction in the oxidation of the cathode shield and reduced tungsten deposition onto the cathode sidewall 504 is readily apparent when compared to the conventional cathode and shield of FIG. 4.

Figure 6:
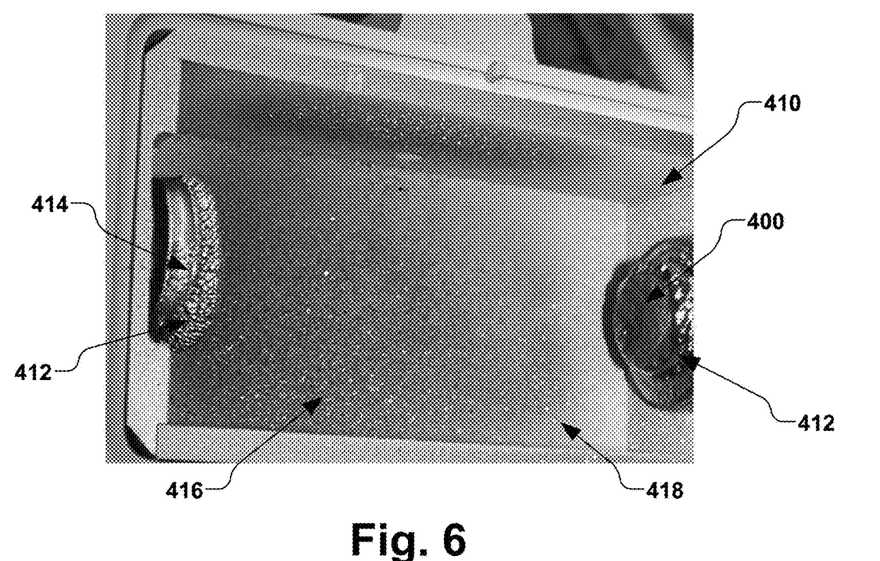
FIG. 6 illustrates a conventional arc chamber after running 30 hours with no co-gas.

FIG. 6 illustrates a conventional cathode in a conventional arc chamber 410 after running 30 hours of $GeF_4$ with no co-gas. Excessive deposition of tungsten 412 onto the cathode 400 and the repeller 414 and the etching of the arc chamber liners 416, 418 are clearly present.

Figure 7:
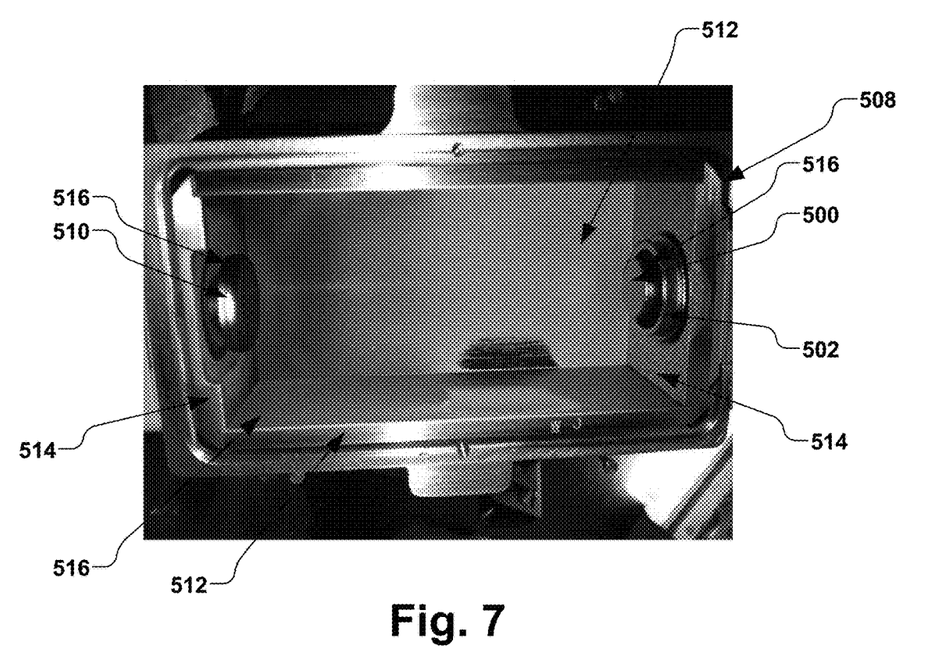
FIG. 7 illustrates a lanthanated tungsten arc chamber after running 30 hours with various source materials with no co-gas.

FIG. 7 illustrates an arc chamber 508 having one or more components (e.g., one or more of the cathode 500, cathode shield 502, repeller 510, chamber walls 512, extraction aperture (not shown), lines 514, and the like formed of lanthanum tungsten after running $GeF_4$, $SiF_4$ and $BF_3$ with no co-gas for 10 hours each. As illustrated in FIG. 7, all of the exposed surfaces 516 in arc chamber are formed of lanthanated tungsten, but such an example is not to be considered limiting. As shown in FIG. 6 there is no significant deposition of tungsten onto the cathode and the repeller (e.g., no halogen cycle is present), where there are minimal signs of etching of the arc chamber liner(s) 514.

Figure 8:
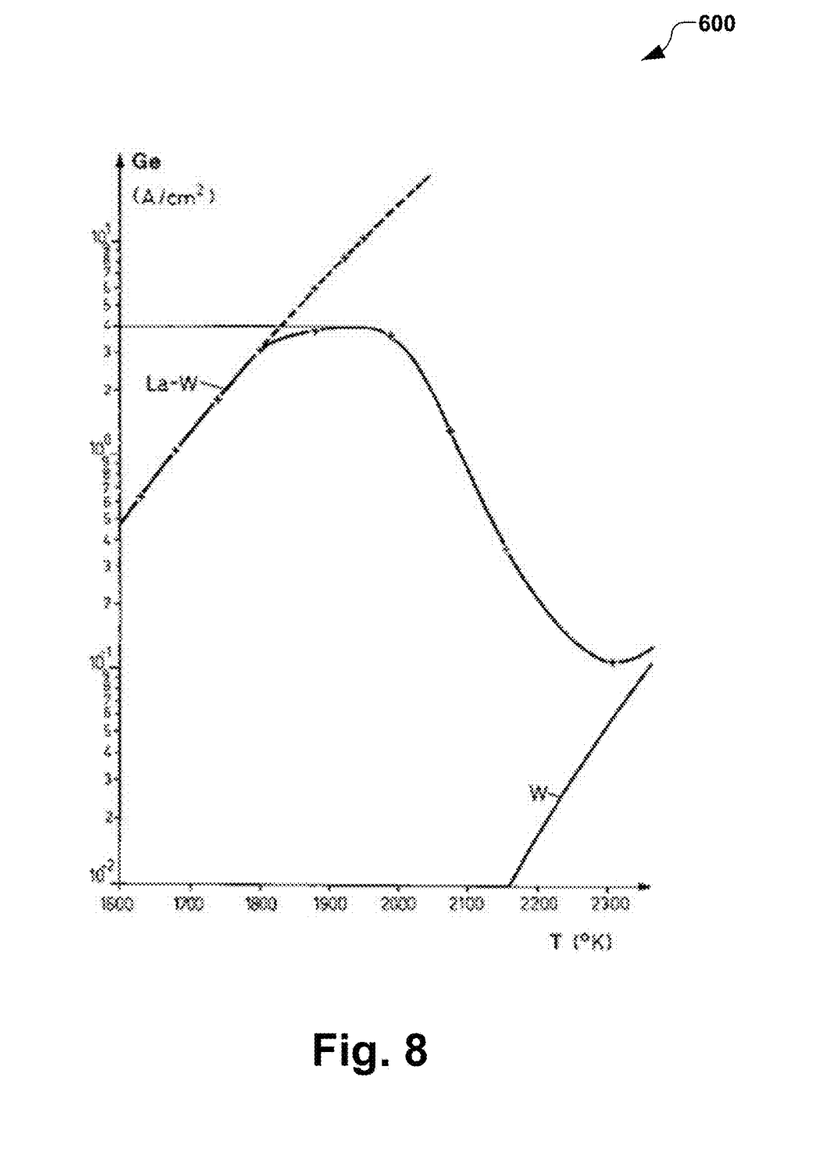
FIG. 8 graphically illustrates emission characteristics of pure tungsten and lanthanated tungsten.

FIG. 8 is graph 600 illustrating emission characteristics of pure tungsten and lanthanated tungsten, where the maximum stable emission of 4 $A/cm^2$ is at 1900 K (e.g., reference to thoriated tungsten of 3 $A/cm^2$ at 2100 K). Pure tungsten, for example, thermionic emission is one hundred times less at ~2300 K.

Figure 9:
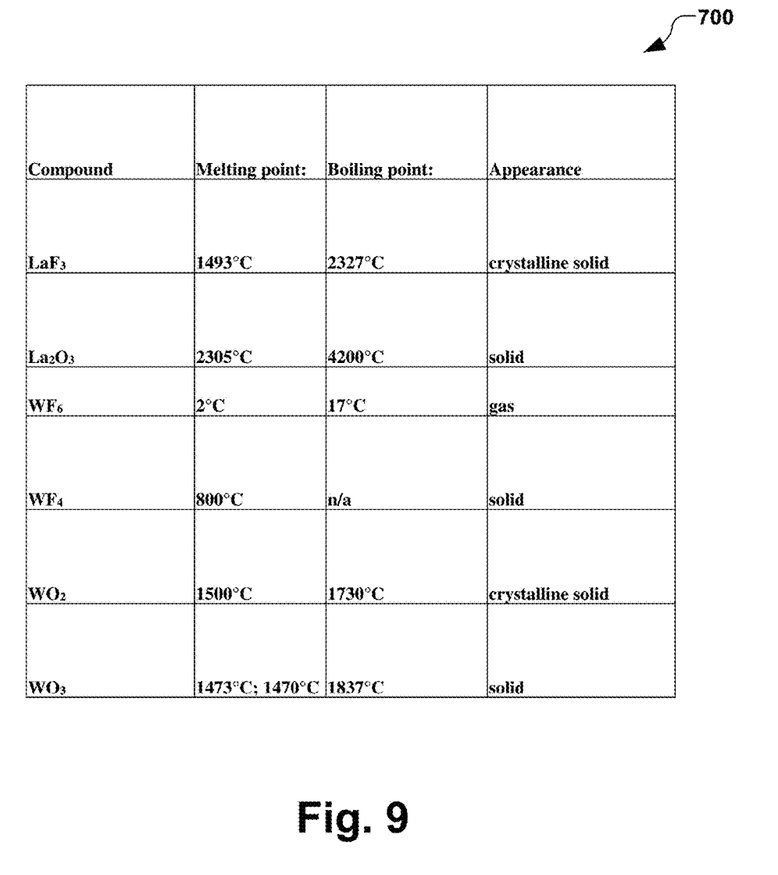
FIG. 9 is a chart illustrating various characteristics of various compounds.

FIG. 9 is a table 700 illustrating characteristics for various materials after reacting with fluorine and oxygen. Lanthanum oxide, for example, has a melting point approximately 1000° C. higher than standard tungsten dioxide, which means that it is much more stable. The arc chamber liners described above typically operate at approximately 700-800° C., the cathode operates at approximately 2500° C., and the cathode shield operates at approximately 2000° C. Accordingly, lanthanated tungsten components provide a stable compound, which doesn't break down easily at high temperatures after reacting with fluorine.

When running carbons with oxygens (or any gas with oxygen), a significant amount of tungsten dioxide and tungsten trioxide can be formed in the arc chamber. When a subsequent transition to boron is desired, the ion source is unstable until the oxygen disposed therein is removed. Thus, until the oxygen is removed, the previous tuning solution associated with the ion source will not work well. Thus, in accordance with the present disclosure, since there is no tungsten dioxide formed, the lanthanated tungsten provides for a passivating of the chamber, thus protecting it, and not forming a significant amount of $WO_2$ or $WO_3$.

In accordance with one example, extraction electrodes utilized in extract the ions from the ion source (e.g., optics plates) can be made of lanthanated tungsten. When fluorine is utilized in a conventional tungsten extraction electrode, for example, the fluorine will sputter the apertures and combine to form tungsten fluoride (WF) gas, which is corrosive. Further, insulators are often provided between the extraction plates, whereby the fluorinated tungsten will attack the insulators ($Al_2O_3$), which further creates a deleterious conductive coating on the insulator. Thus, in accordance with the present disclosure, the aperture plates are formed of lanthanated tungsten, thus mitigating such deleterious conduction.

The present disclosure contemplates components upstream of the AMU magnet to be comprised of lanthanated tungsten, such as the ion source, extraction electrode optics, and exit of source chamber. Arc chamber internal components may be comprised of lanthanated tungsten, such as any liners, arc slit, cathode, repeller, and cathode shield associated with the ion source chamber. Further, the AMU entrance aperture can also be comprised of lanthanated tungsten. Additionally, components further downstream of AMU (e.g., anywhere along the beamline) may be comprised of lanthanated tungsten in a similar manner.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A process for implanting carbon into a substrate, the process comprising:
ionizing a carbon oxide gas source and a co-gas comprising phosphine in an ion source chamber to produce carbon ions and phosphorous oxide;
detecting formation of phosphorous oxide based on analysis of atomic mass unit spectra;
determining a final ratio between the carbon oxide gas source and the co-gas comprising the phosphine when the phosphorous oxides are no longer detectable; and
implanting the carbon ions into the substrate.

2. The process of claim 1, wherein the carbon oxide source comprises carbon suboxide, carbon monoxide, carbon dioxide, a carbon containing gas and an oxygen gas mixture or combinations thereof.

3. The process of claim 1, wherein the ion source chamber comprises one or more components formed of or coated with lanthanum tungsten.

4. The process of claim 3, wherein the one or more components are selected from the group consisting of a cathode, cathode shield, a repeller, a liner, an arc slit, a source chamber wall, a liner, aperture plates, extraction electrodes, and an arc chamber body.

5. The process of claim 1, wherein the phosphine relative to the carbon oxide gas is at a ratio such that formation of the phosphorous oxides is at about zero.

6. The process of claim 3, wherein the carbon oxide gas is carbon monoxide and reacts with the phosphine in accordance with reaction scheme I:

$$24CO+8PH_3+4LaW \rightarrow 22C^++24OH+2CO+2La_2O_3+4W+P_4O_{10}+P_4O_6. \qquad I.$$

7. The process of claim 1, wherein the lanthanated tungsten comprises lanthanum in an amount from 1 to 3% by weight.

8. A process for implanting carbon ions into a workpiece, the process comprising:
supplying a mixture of a carbon oxide gas and a phosphine gas to an ion source, wherein the ion source and an ion implantation system containing the ion source comprises a cathode, a cathode shield, and/or a repeller formed of or coated with lanthanum tungsten;
ionizing the carbon oxide gas and the phosphine gas with the ion source at a stoichiometry effective to create a feedstream of ionized carbon and a byproduct comprising phosphorous oxides;
extracting the ionized carbon within the plasma to form an ion beam; and
exposing the workpiece to the ion beam to implant the ionized carbon into the workpiece.

9. The process of claim 8, wherein the carbon oxide gas is selected from the group of gases consisting of carbon monoxide, carbon dioxide, carbon suboxide, a carbon-containing gas and an oxygen gas mixture, and combinations thereof.

10. The process of claim 8, wherein the phosphine gas relative to the carbon oxide gas is at a ratio such that formation of the phosphorous oxides is at about zero.

11. The process of claim 8, further comprising evacuating the phosphorous oxides from the ion source chamber.

12. The process of claim 8, wherein the carbon oxide gas is carbon monoxide and reacts with the phosphine gas in accordance with reaction scheme I:

$$24CO+8PH_3+4LaW \rightarrow 22C^++24OH+2CO+2La_2O_3+4W+P_4O_{10}+P_4O_6. \qquad I.$$

13. The process of claim 11, wherein the lanthanated tungsten comprises lanthanum in an amount from 1 to 3% by weight of the component or the coating, respectively.

* * * * *